US011810980B2

(12) United States Patent
Ku et al.

(10) Patent No.: US 11,810,980 B2
(45) Date of Patent: Nov. 7, 2023

(54) CHANNEL FORMATION FOR THREE DIMENSIONAL TRANSISTORS

(71) Applicant: Intel Corporation, Santa Clara, CA (US)

(72) Inventors: Chieh-Jen Ku, Hillsboro, OR (US); Pei-Hua Wang, Beaverton, OR (US); Bernhard Sell, Portland, OR (US); Martin M. Mitan, Beaverton, OR (US); Leonard C. Pipes, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 982 days.

(21) Appl. No.: 16/457,621

(22) Filed: Jun. 28, 2019

(65) Prior Publication Data

US 2020/0411697 A1 Dec. 31, 2020

(51) Int. Cl.
  *H01L 29/786* (2006.01)
  *H01L 27/12* (2006.01)
  *H01L 21/768* (2006.01)
  *H01L 29/66* (2006.01)
  *H01L 27/06* (2006.01)

(52) U.S. Cl.
  CPC .. *H01L 29/78696* (2013.01); *H01L 21/76829* (2013.01); *H01L 27/0688* (2013.01); *H01L 27/1259* (2013.01); *H01L 29/6675* (2013.01); *H01L 29/78618* (2013.01)

(58) Field of Classification Search
  CPC ......... H01L 29/78696; H01L 21/76829; H01L 27/0688; H01L 27/1259; H01L 29/6675; H01L 29/78618; H01L 21/84; H01L 27/1203; H01L 29/7869
  See application file for complete search history.

(56) References Cited

U.S. PATENT DOCUMENTS

| 11,205,664 | B2* | 12/2021 | Yamazaki | H01L 27/1225 |
| 11,211,500 | B2* | 12/2021 | Yamazaki | H01L 29/66969 |
| 11,245,040 | B2* | 2/2022 | Yamazaki | H01L 27/108 |
| 11,424,369 | B2* | 8/2022 | Yamazaki | H01L 29/4966 |
| 2009/0152635 | A1* | 6/2009 | Jeong | H01L 27/1214 257/E29.273 |
| 2013/0299817 | A1* | 11/2013 | Park | H01L 29/7869 257/E29.296 |
| 2014/0001464 | A1* | 1/2014 | Park | H01L 29/66742 257/43 |
| 2014/0152936 | A1* | 6/2014 | Kim | H01L 29/78696 252/519.1 |
| 2015/0034942 | A1* | 2/2015 | Kim | H01L 29/78696 257/43 |
| 2016/0315168 | A1* | 10/2016 | Dussarrat | H01L 29/78681 |

(Continued)

*Primary Examiner* — Douglas W Owens
(74) *Attorney, Agent, or Firm* — Schwabe, Williamson & Wyatt, P.C.

(57) ABSTRACT

Embodiments herein describe techniques for a transistor above a substrate. The transistor includes a channel layer above the substrate. The channel layer includes a first channel material of a first conductivity. In addition, the channel layer further includes elements of one or more additional materials distributed within the channel layer. The channel layer including the elements of the one or more additional materials has a second conductivity different from the first conductivity. Other embodiments may be described and/or claimed.

21 Claims, 7 Drawing Sheets

(56) References Cited

U.S. PATENT DOCUMENTS

| | | | |
|---|---|---|---|
| 2017/0236949 A1* | 8/2017 | Yamazaki | H01L 29/78648 |
| | | | 257/43 |
| 2018/0143474 A1* | 5/2018 | Inoue | H01L 27/1244 |
| 2019/0305101 A1* | 10/2019 | Sharma | H01L 29/78609 |
| 2020/0098657 A1* | 3/2020 | Sen Gupta | H01L 29/401 |
| 2020/0411686 A1* | 12/2020 | Haratipour | H01L 29/7827 |

* cited by examiner

CHANNEL FORMATION FOR THREE DIMENSIONAL TRANSISTORS

FIELD

Embodiments of the present disclosure generally relate to the field of integrated circuits, and more particularly, to transistors.

BACKGROUND

Transistors play an essential role in modern day electronic devices that are a part of daily life. There are various transistors. A thin-film transistor (TFT) is a kind of field-effect transistor including a channel layer, a gate electrode, and source and drain electrodes, over a supporting but non-conducting substrate. On the other hand, a conventional transistor has a channel typically within a substrate, such as a silicon substrate. TFTs have emerged as an attractive option to fuel Moore's law by integrating TFTs vertically in the backend, while leaving the silicon substrate areas for high-speed transistors. However, TFTs still face many challenges. For example, a TFT may have performance degradation in high temperature, e.g., higher than 400 C, and in chemical environment, e.g., hydrogen based gas.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1A:
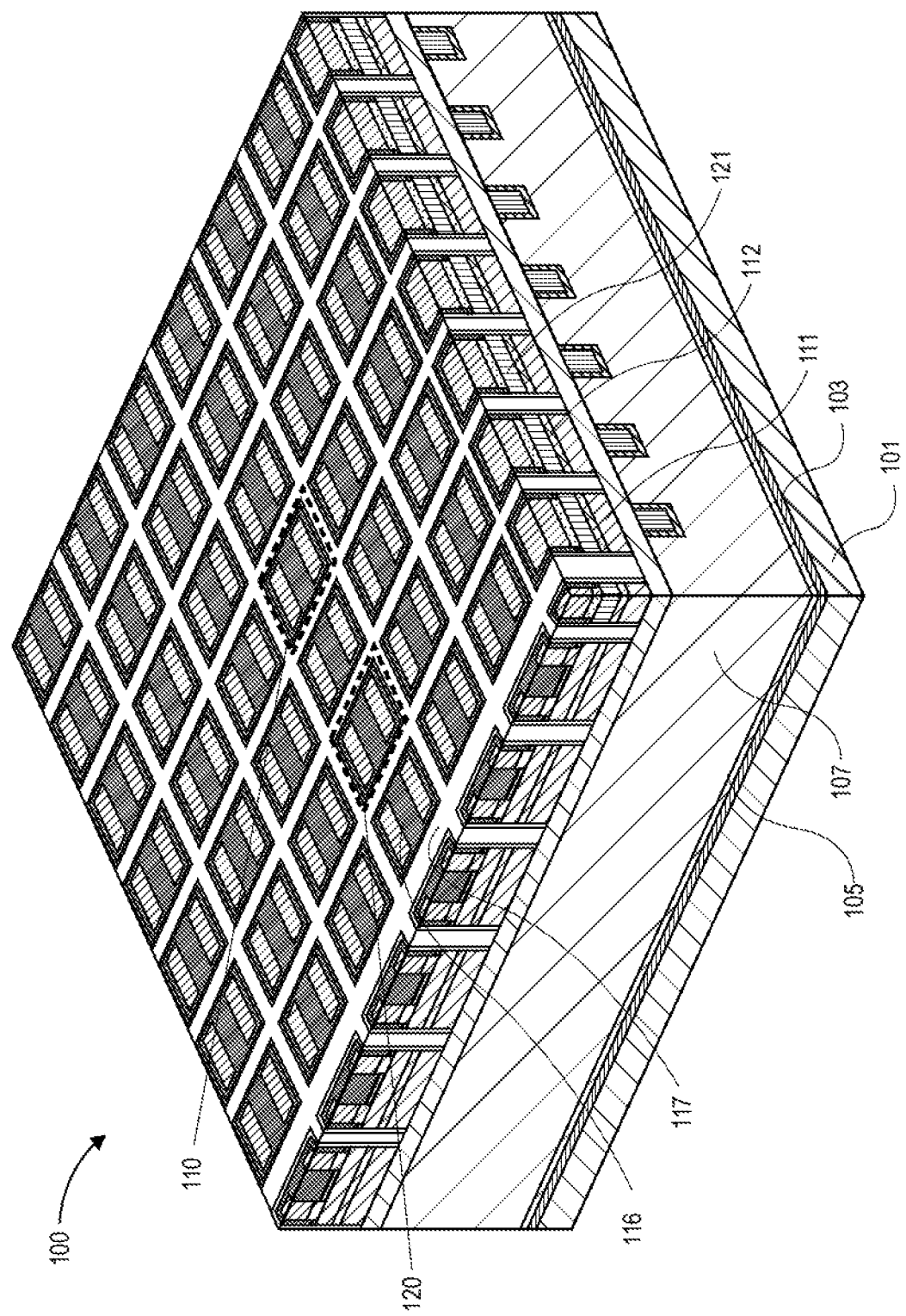
FIGS. 1(a)-1(c) schematically illustrate diagrams in various views of a semiconductor device including a thin-film transistor (TFT) above a substrate, in accordance with some embodiments.

There are various transistors, e.g., a thin-film transistor (TFT) with a channel formed over a supporting but non-conducting substrate, or a conventional transistor with a channel typically within a substrate. TFTs have emerged as an attractive option to fuel Moore's law by integrating TFTs vertically in the back end of line (BEOL) semiconductor processing.

Front-end-of-line (FEOL) semiconductor processing and structures may refer to a first portion of IC fabrication where individual devices (e.g., transistors, capacitors, resistors, etc.) are patterned in a semiconductor substrate or layer. FEOL generally covers everything up to (but not including) the deposition of metal interconnect layers. A transistor formed in FEOL may also be referred to as a front-end transistor. Following the last FEOL operation, the result is typically a wafer with isolated transistors (e.g., without any wires). BEOL semiconductor processing and structures may refer to a second portion of IC fabrication where the individual devices (e.g., transistors, capacitors, resistors, etc.) are interconnected with wiring on the wafer, e.g., the metallization layer or layers. BEOL includes an interconnect structure having metal contacts, dielectrics layers, e.g., inter-level dielectric (ILD) layers, metal levels, and bonding sites for chip-to-package connections. In the BEOL part of the fabrication, metal contacts, pads, interconnect wires, vias, and dielectric structures may be formed. For modern IC processes, more than 10 metal layers may be added in the BEOL. A TFT is normally formed at BEOL. However, performance of a TFT at the BEOL may degrade in high temperature, e.g., higher than 400 C, and in chemical environment, e.g., hydrogen based gas.

Embodiments herein may present a TFT having a channel layer including an original or a first channel material, e.g., IGZO, and further including elements of one or more additional materials different from the first channel material. The elements of one or more additional materials may be added to the channel layer by in situ doping, ion beam implantation, or plasma immersion. The elements of the one or more additional materials are bonded with elements of the first channel material. As a result, the conductivity of the channel layer with the elements of the one or more additional materials is different from the conductivity of the first channel material alone. Incorporation of the elements of the one or more additional materials forms stronger bonds inside the first channel material, e.g., IGZO, suppressing defect formation during high temperature or hydrogen based chemical vapor reaction. A TFT having such a channel layer has improved performance in high temperature and in chemical environment.

Embodiments herein may present a semiconductor device including a substrate, and a transistor above the substrate. The transistor includes a channel layer above the substrate. The channel layer includes a first channel material of a first conductivity. In addition, the channel layer further includes elements of one or more additional materials distributed within the channel layer. The channel layer including the elements of the one or more additional materials has a second conductivity different from the first conductivity.

Embodiments herein may present a method for forming a transistor. The method may include forming a gate electrode above a dielectric layer, where the dielectric layer is above a substrate, and forming a gate dielectric layer above the gate electrode. In addition, the method includes forming a channel layer above the gate dielectric layer, where the channel layer includes a first channel material of a first conductivity. Afterwards, the method includes adding elements of one or more additional materials into the channel layer. The elements of the one or more additional materials are bonded with elements of the first channel material, and the channel layer including the elements of the one or more additional materials has a second conductivity different from the first conductivity.

Embodiments herein may present a computing device, which may include a circuit board, and a processor or a memory device coupled to the circuit board. The processor or the memory device includes a transistor. The transistor includes a channel layer above a substrate. The channel layer includes a first channel material of a first conductivity. In addition, the channel layer further includes elements of one or more additional materials distributed within the channel layer. The channel layer including the elements of the one or more additional materials has a second conductivity different from the first conductivity.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1B:
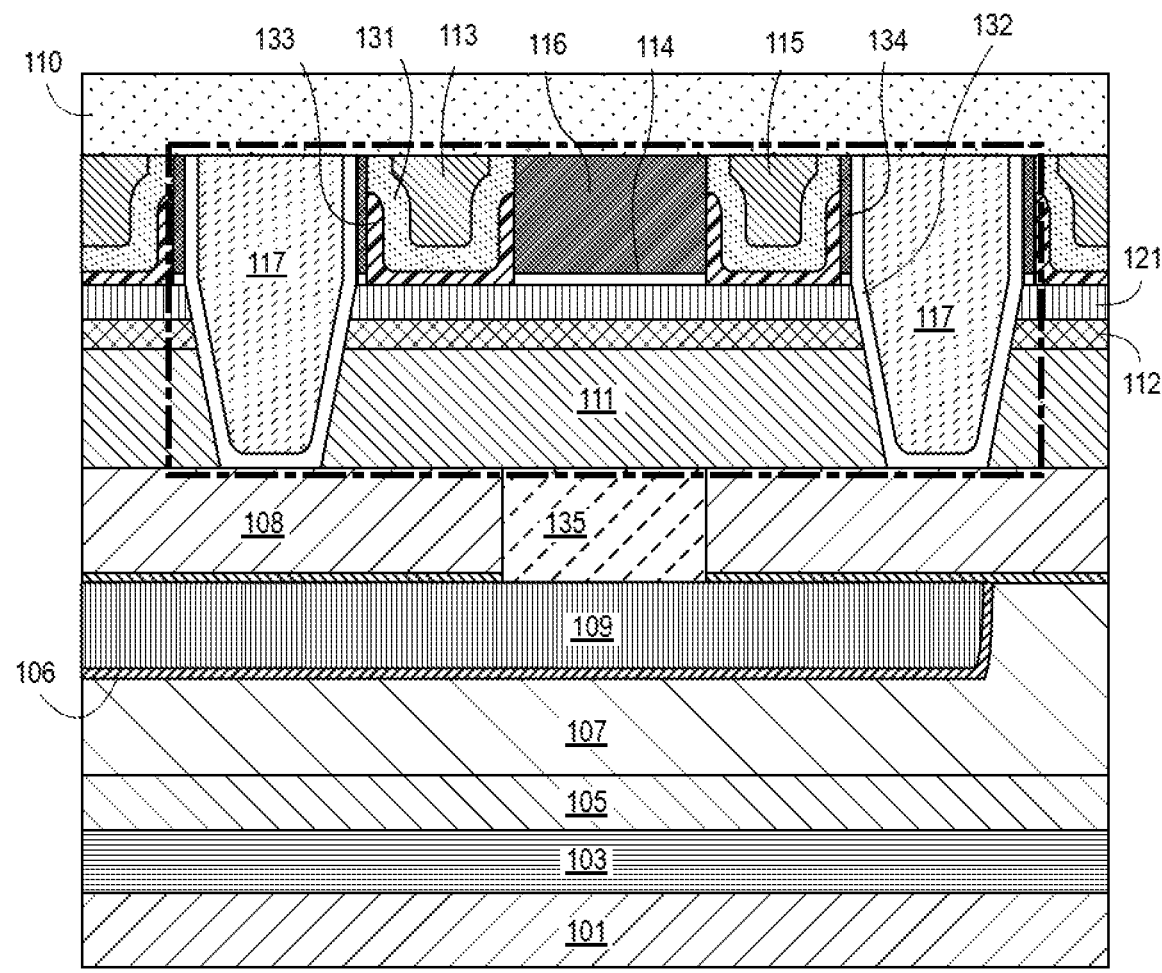
Figure 1C:
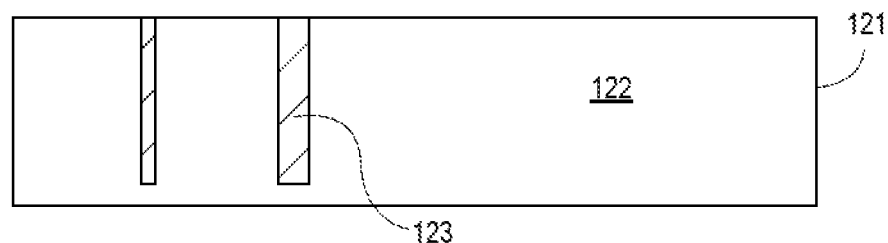

FIGS. 1(a)-1(c) schematically illustrate diagrams in various views of a semiconductor device including a TFT 110 above a substrate 101, in accordance with some embodiments. FIG. 1(a) shows a semiconductor device 100 including the TFT 110 in three-dimensional view. FIG. 1(b) shows the TFT 110 in more detail in a cross sectional view. FIG. 1(c) shows more details of a channel layer 121 of the TFT 110.

In embodiments, as shown in FIGS. 1(a)-1(b), the semiconductor device 100 including many devices, e.g., the transistor 110, a transistor 120, formed at BEOL above the substrate 101. The BEOL includes various layers, e.g., an oxide layer 103, an etch stop layer 105, an ILD 107, a metal contact or a metal interconnect 109 in a metal layer, and a barrier layer 106 around the metal contact 109. The various layers shown in the semiconductor device 100 are for examples only, and are not limiting. In some other embodiments, there may be less or more layers than those shown in FIG. 1(a).

In embodiments, as shown in FIGS. 1(a)-1(b), the transistor 110 includes a gate electrode 111 above an etch stop layer 108, and coupled to the metal contact 109 by a via 135 through the etch stop layer 108. A gate dielectric layer 112 is above the gate electrode 111, and the channel layer 121 is above the gate dielectric layer 112. Hence, the gate electrode 111 is separated from the channel layer 121 by the gate dielectric layer 112. An optional capping layer 114 is above the channel layer 121. The transistor 110 further includes a source electrode 113, and a drain electrode 115 coupled to the channel layer 121. The drain electrode 115 and the source electrode 113 are separated by a spacer 116 above the capping layer 114. In addition, there may be various layers around the drain electrode 115 and the source electrode 113. For example, there may be a conducting oxide 131, and a barrier layer 133 around the source electrode 113 or the drain electrode 115. In some embodiments, the conducting oxide 131, and a barrier layer 133 may include HfOx or AlOx. The transistor 110 is separated from other devices or transistor by isolation area 117. The isolation area 117 may further include a barrier layer 132 and a spacer 134.

In embodiments, as shown in more details in FIG. 1(c), the channel layer 121 includes a first channel material 122, and elements of one or more additional materials 123 distributed within the channel layer 121. The first channel material 122 has a first conductivity. The elements of the one or more additional materials 123 are bonded with elements of the first channel material 122. In embodiments, the one or more additional materials 123 include a material selected from the group consisting of N, Si, F, Ar, He, C, and O. The elements of the one or more additional materials 123 may be distributed uniformed in the channel layer, with a concentration level in a range from about $10^{16}$/cm$^3$ to about $10^{19}$/cm$^3$. The channel layer 121 including the elements of the one or more additional materials 123 has a second conductivity different from the first conductivity. For example, the first conductivity has a first mobility in a range of about 50 cm$^2$/V-s to about 500 cm$^2$/V-s, while the second conductivity has a second mobility in a range of about 1 cm$^2$/V-s to about 30 cm$^2$/V-s. Accordingly, the channel layer 121 including the elements of the one or more additional materials 123 can form stronger bonds inside the first channel material 122, suppressing defect formation during high temperature or hydrogen based chemical vapor reaction. Hence, the transistor 110 has improved performance in high temperature and in chemical environment.

In embodiments, the capping layer 114 is a dielectric layer including a material selected from the group consisting of AlOx, TiOx, SiOx, HfOx, SiNx, and ZrOx. In some other embodiments, the capping layer 114 is a metallic layer including a material selected from the group consisting of Si, Ti, and Al. The capping layer has a thickness in a range of about 1 nm to about 5 nm.

In embodiments, an electrode, e.g., the gate electrode 111, the source electrode 113, or the drain electrode 115, may include germanium (Ge), cobalt (Co), titanium (Ti), tungsten (W), molybdenum (Mo), gold (Au), platinum (Pt), aluminum (Al), nickel (Ni), copper (Cu), chromium (Cr), hafnium (Hf), indium (In), ruthenium (Ru), iridium (Ir), tantalum (Ta), or an alloy of Ti, W, Mo, Au, Pt, Al, Ni, Cu, Cr, Hf, HfAlN, iridium-tantalum alloy (Ir—Ta), indium-tin oxide (ITO), TaN, TiN, TiAlN, TiW, or InAlO. In some embodiments, the gate electrode 111, the source electrode 113, or the drain electrode 115 may include multiple layers.

In embodiments, the first channel material 122 in the channel layer 121 may include a material selected from the group consisting of CuS$_2$, CuSe$_2$, WSe$_2$, MoS$_2$, MoSe$_2$, WS$_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, Si$_2$BN, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

In embodiments, the substrate 101 may be a bulk substrate, a silicon-on-insulator (SOI) substrate, a silicon substrate, a glass substrate, a metal substrate, or a plastic substrate. The substrate 101 may have a thickness around 500 um to around 1000 um. In embodiments, the ILD layer 107 may include a material selected from the group consisting of silicon dioxide (SiO$_2$), carbon doped oxide (CDO), silicon nitride, perfluorocyclobutane, polytetrafluoroethylene, fluorosilicate glass (FSG), organic polymer, silsesquioxane, siloxane, and organosilicate glass.

In embodiments, the gate dielectric layer 112 may include a high-k dielectric material. For example, the gate dielectric layer 112 includes a HfO$_2$, ZrO$_2$, TiO$_2$, Ta$_2$O$_5$, Nb$_2$O$_5$, a rare earth oxide, MgO, ferroelectric oxide, barium titanate, perovskite ferroelectrics, lead zirconate, PZT, or a high-k dielectric material selected from the group consisting of hafnium silicate, zirconium silicate, hafnium dioxide, zirconium dioxide, aluminum oxide, and nitride hafnium silicate.

In addition, there may be other components of the transistor 110, not shown. For example, the transistor 110 further includes an epitaxial layer between the source area and the source electrode, or between the drain area and the drain electrode. The epitaxial layer may include a material selected from a group consisting of SiP, Si, Si$_{1-x}$Ge$_x$, and SiC.

Figure 2:
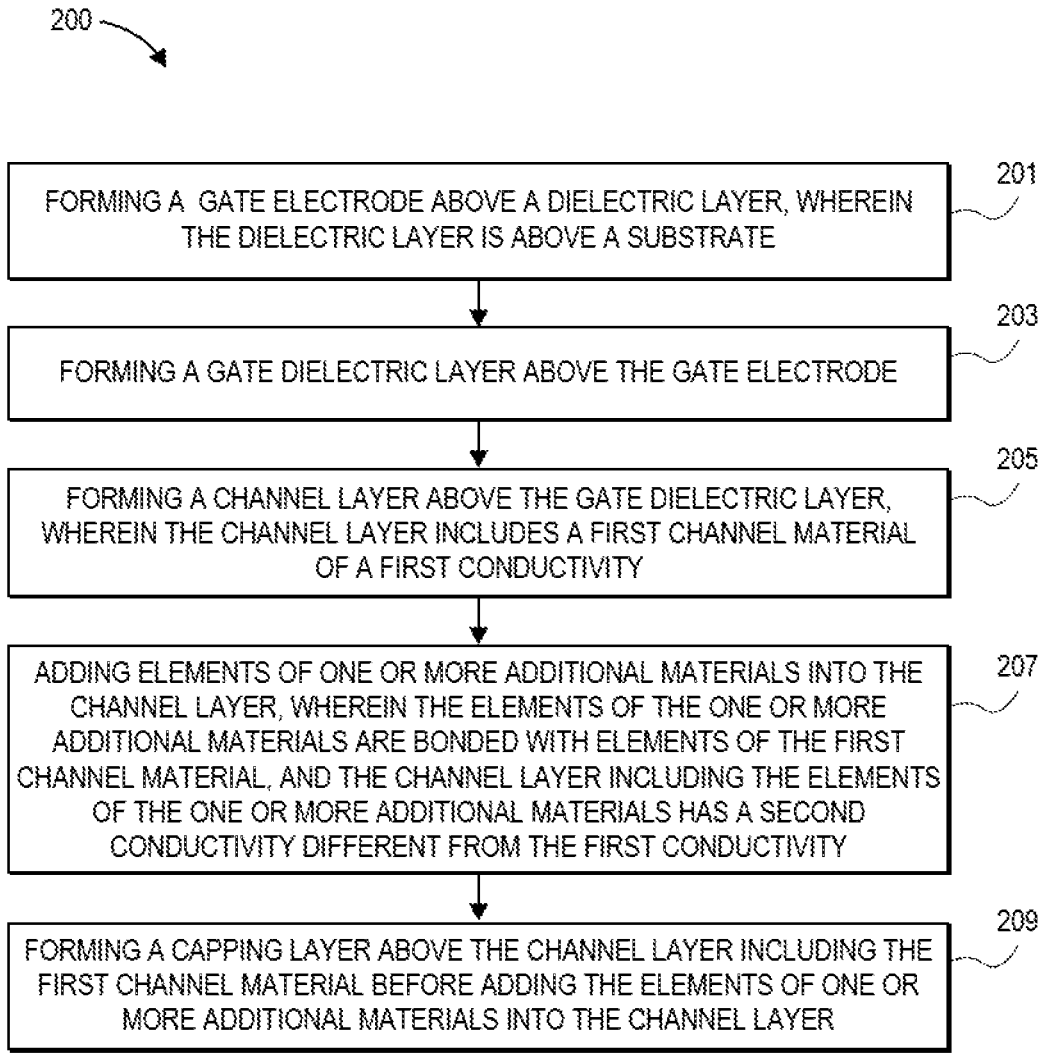
FIG. 2 schematically illustrates a process for forming a TFT, in accordance with some embodiments.
Figure 3:
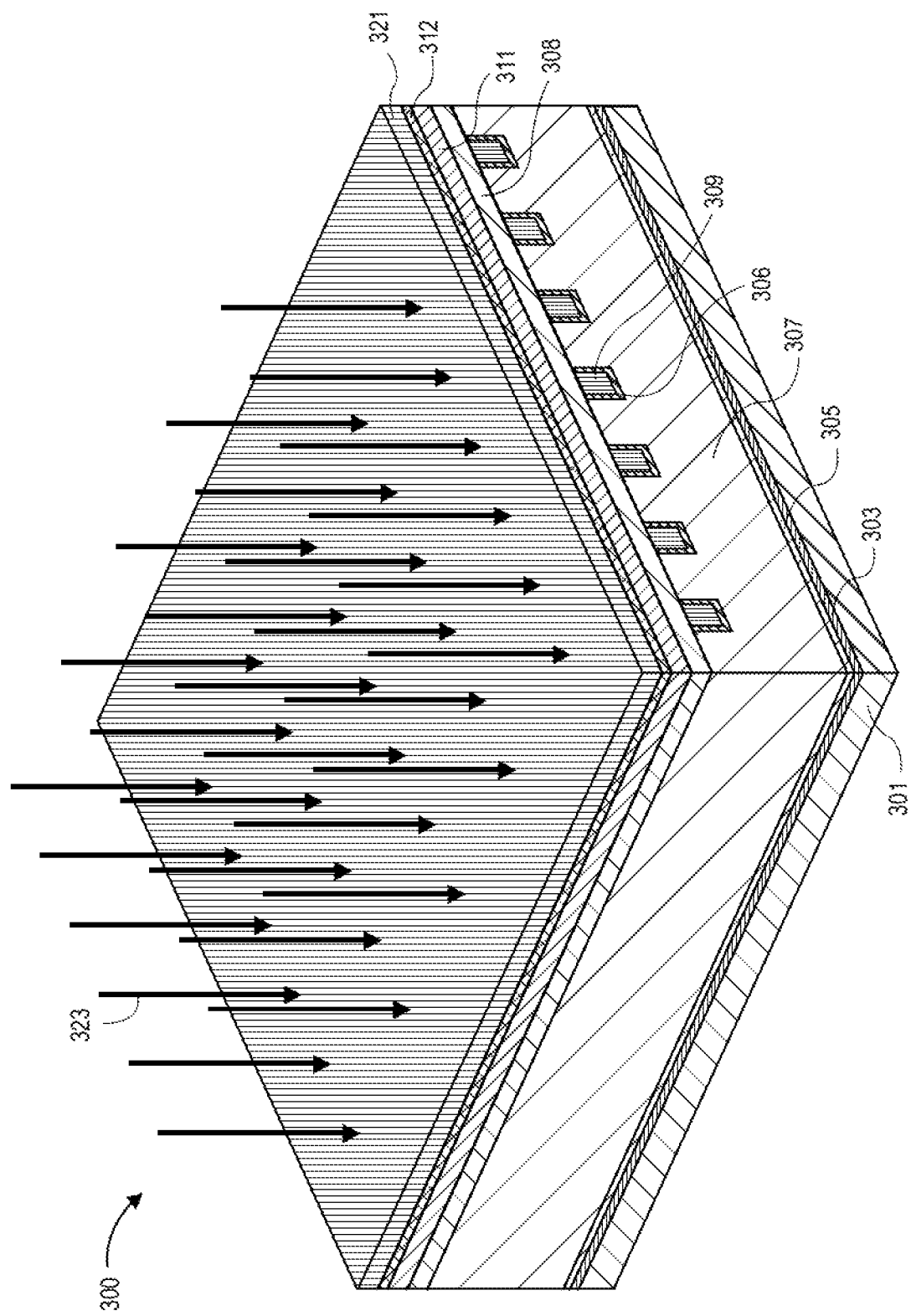
FIG. 3 illustrates operations of a process for forming a TFT, in accordance with some embodiments.

FIG. 2 schematically illustrates a process 200 for forming a TFT, in accordance with some embodiments. In embodiments, the process 200 may be applied to form the transistor 110, or the transistor 120, as shown in FIGS. 1(a)-1(c). The process 200 is illustrated in FIG. 3 for a semiconductor device 300, and in FIG. 4 for a semiconductor device 400.

In embodiments, similar to the semiconductor device 100, the semiconductor device 300 includes various layers on a substrate 301, e.g., an oxide layer 303, an etch stop layer 305, an ILD 307, a metal contact or a metal interconnect 309 formed in a metal layer, and a barrier layer 306 around a metal contact 309. In addition, the semiconductor device 300 further includes an etch stop layer 308, one or more gate electrodes to be formed on a metal layer referred to as a gate electrode layer 311, a gate dielectric layer 312 above the gate electrode layer 311, and a channel layer 321 above the gate dielectric layer 312. Operations shown in FIG. 3 are only for forming the channel layers, while operations for other layers or components are not shown. Other components, e.g., source electrodes, and drain electrodes are not shown. After individual transistors are formed in the semiconductor device 300, various isolation areas and interconnects may be formed to isolate individual transistors, and further connect the individual transistors according to desired functions. The source electrodes, and drain electrodes, isolation areas, and interconnects are not shown in FIG. 3.

Figure 4:
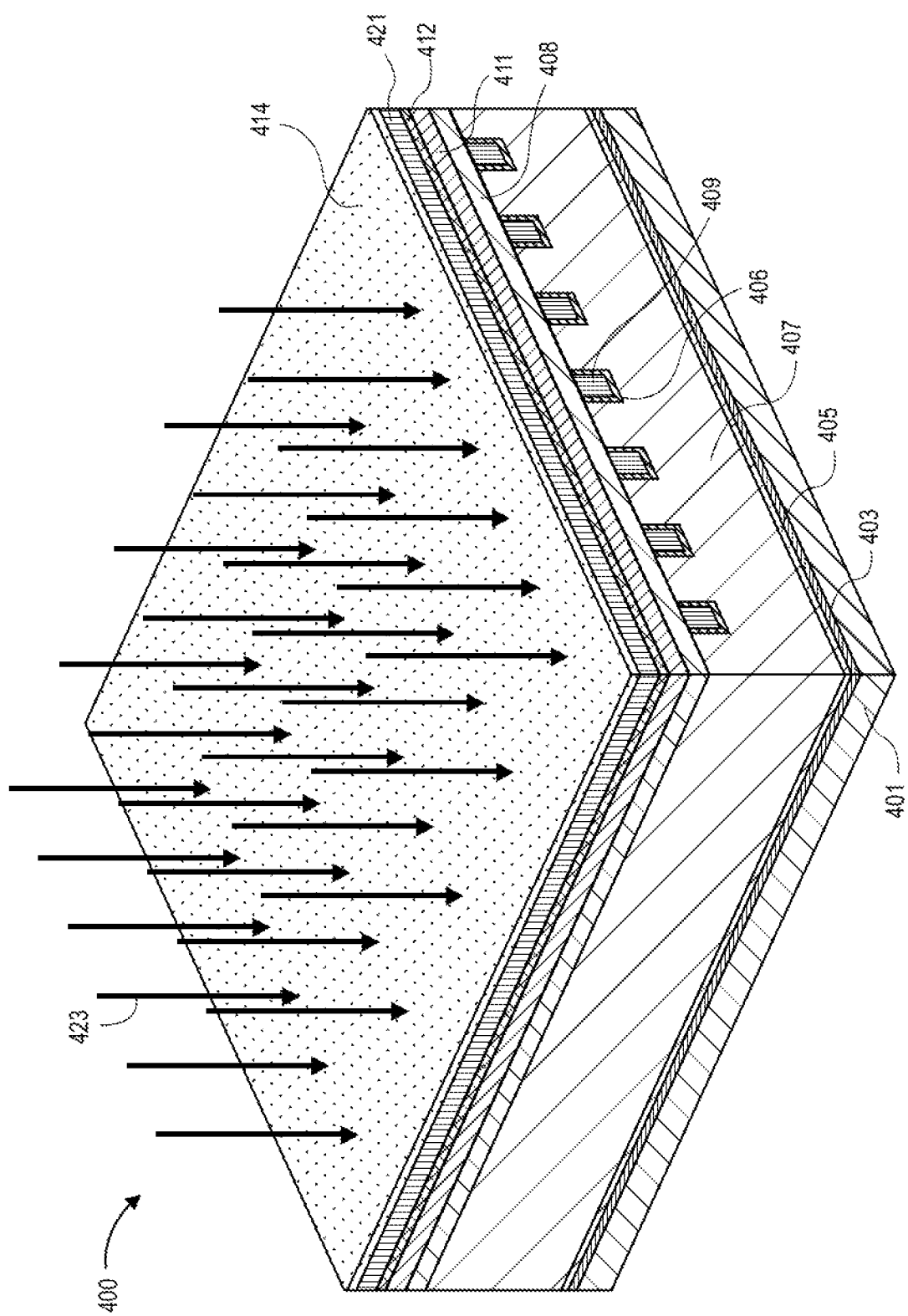
FIG. 4 illustrate operations of a process for forming a TFT, in accordance with some embodiments.

In embodiments, similar to the semiconductor device 300, the semiconductor device 400 includes various layers on a substrate 401, e.g., an oxide layer 403, an etch stop layer 405, an ILD 407, a metal contact or a metal interconnect 409 formed in a metal layer, and a barrier layer 406 around a metal contact 409. In addition, the semiconductor device 400 further includes an etch stop layer 408, one or more gate electrodes to be formed on a metal layer referred to as a gate electrode layer 411, a gate dielectric layer 412 above the gate electrode layer 411, a channel layer 421 above the gate dielectric layer 412, and a capping layer 414 above the channel layer 421. Operations shown in FIG. 4 are only for forming the channel layers, while operations for other layers or components are not shown. Other components, e.g., source electrodes, and drain electrodes are not shown. After individual transistors are formed in the semiconductor device 400, various isolation areas and interconnects may be formed to isolate individual transistors, and further connect the individual transistors according to desired functions. The source electrodes, and drain electrodes, isolation areas, and interconnects are not shown in FIG. 4.

At block 201, the process 200 may include forming a gate electrode above a dielectric layer, wherein the dielectric layer is above a substrate. For example, as shown in FIG. 3, the process 200 may include forming the gate electrode layer 311 above the etch stop layer 308. A gate electrode may be formed on the gate electrode layer 311 by various isolation areas, which may be formed later. As shown in FIG. 4, the process 200 may include forming the gate electrode layer 411 above the etch stop layer 408. A gate electrode may be formed on the gate electrode layer 411 by various isolation areas, which may be formed later.

At block 203, the process 200 may include forming a gate dielectric layer above the gate electrode. For example, as shown in FIG. 3, the process 200 may include forming the gate dielectric layer 312 above the gate electrode layer 311. As shown in FIG. 4, the process 200 may include forming the gate dielectric layer 412 above the gate electrode layer 411.

At block 205, the process 200 may include forming a channel layer above the gate dielectric layer, wherein the channel layer includes a first channel material of a first conductivity. For example, as shown in FIG. 3, the process 200 may include forming the channel layer 321 above the gate dielectric layer 312, where the channel layer 321 includes a first channel material of a first conductivity. As shown in FIG. 4, the process 200 may include forming the channel layer 421 above the gate dielectric layer 412, wherein the channel layer 421 includes a first channel material of a first conductivity.

At block 207, the process 200 may include adding elements of one or more additional materials into the channel layer, wherein the elements of the one or more additional materials are bonded with elements of the first channel material, and the channel layer including the elements of the one or more additional materials has a second conductivity different from the first conductivity. For example, as shown in FIG. 3, the process 200 may include adding elements of one or more additional materials 323 into the channel layer 321. The elements of the one or more additional materials 323 are added into the channel layer by in situ doping, ion beam implantation, or plasma immersion. The elements of the one or more additional materials 323 are bonded with elements of the first channel material in the channel layer 321, and the channel layer 321 including the elements of the one or more additional materials 323 has a second conductivity different from the first conductivity.

At block 209, optionally, the process 200 may include forming a capping layer above the channel layer including the first channel material before adding the elements of one or more additional materials into the channel layer. For example, as shown in FIG. 4, the process 200 may include forming the capping layer 414 above the channel layer 421 including the first channel material before adding the elements of one or more additional materials 423 into the channel layer 421. The elements of the one or more additional materials 423 are added into the channel layer 421 by ion beam implantation through the capping layer 414, or plasma immersion through the capping layer 414.

Figure 5:
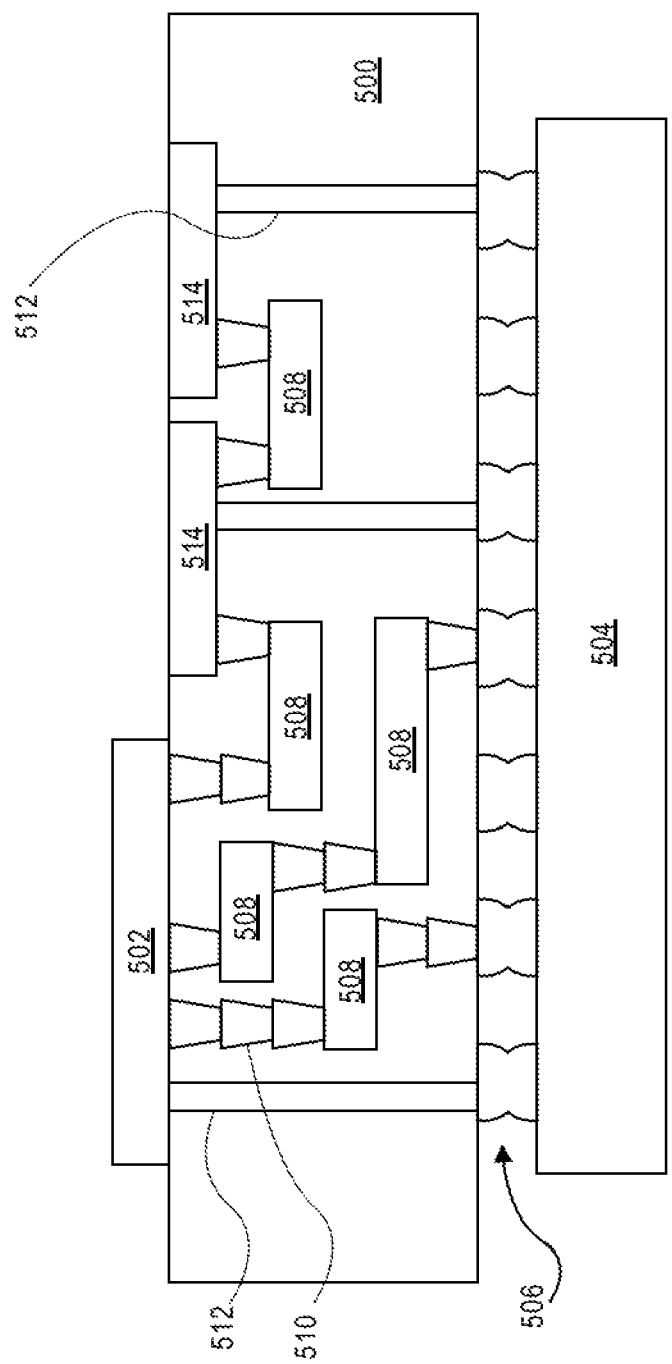
FIG. 5 schematically illustrates an interposer implementing one or more embodiments of the disclosure, in accordance with some embodiments.

FIG. 5 illustrates an interposer 500 that includes one or more embodiments of the disclosure. The interposer 500 is an intervening substrate used to bridge a first substrate 502 to a second substrate 504. The first substrate 502 may be, for instance, a substrate support for a transistor, e.g., the transistor 110, or the transistor 120, as shown in FIGS. 1(a)-1(c). The second substrate 504 may be, for instance, a memory module, a computer motherboard, or another integrated circuit die. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer 500 may be formed of alternate rigid or flexible materials that may include the same materials described above for use in a semiconductor substrate, such as silicon, germanium, and other group III-V and group IV materials.

The interposer 500 may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500.

In accordance with embodiments of the disclosure, apparatuses or processes disclosed herein may be used in the fabrication of interposer 500.

Figure 6:
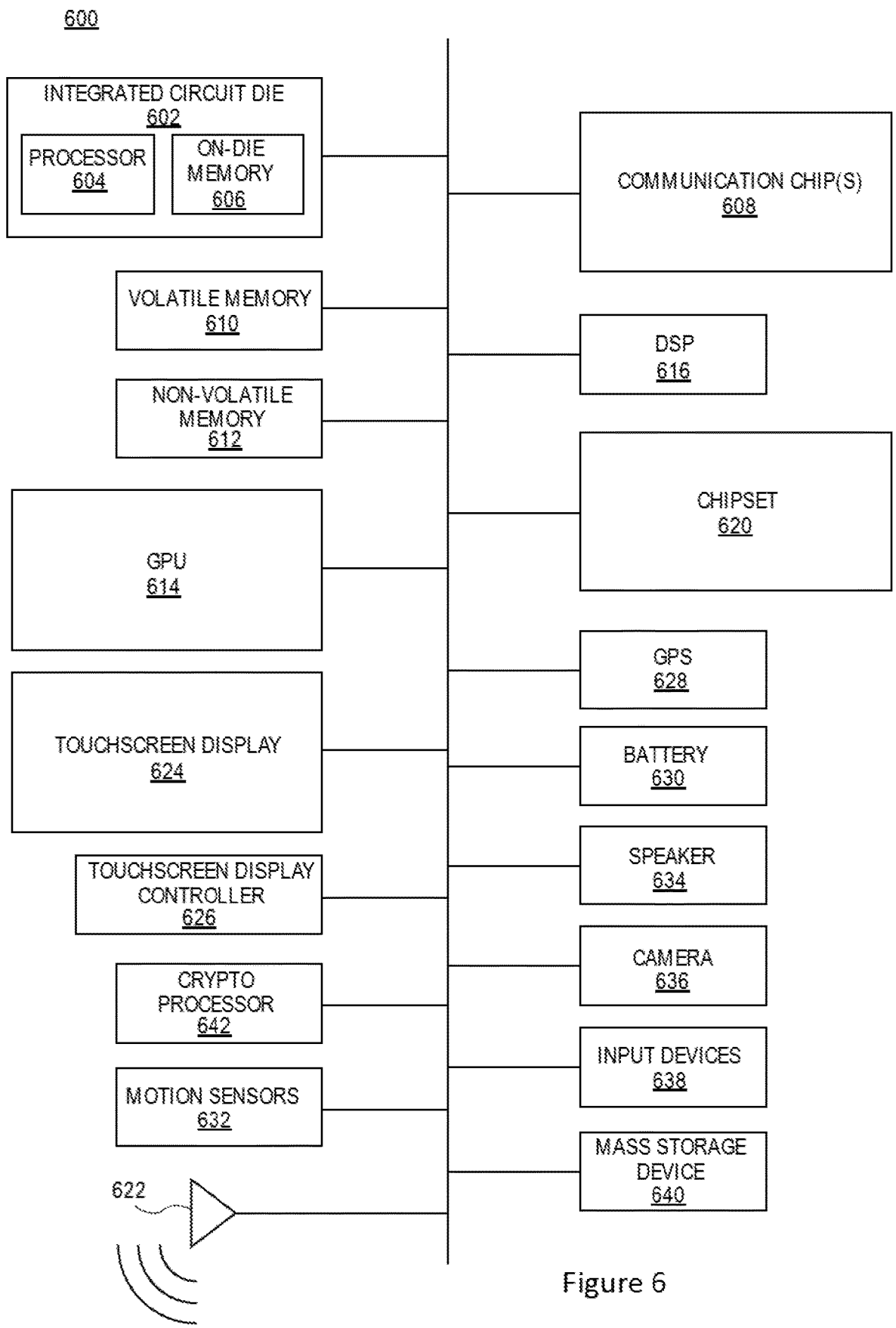
FIG. 6 schematically illustrates a computing device built in accordance with an embodiment of the disclosure, in accordance with some embodiments.

FIG. 6 illustrates a computing device 600 in accordance with one embodiment of the disclosure. The computing device 600 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 600 include, but are not limited to, an integrated circuit die 602 and at least one communications logic unit 608. In some implementations the communications logic unit 608 is fabricated within the integrated circuit die 602 while in other implementations the communications logic unit 608 is fabricated in a separate integrated circuit chip that may be bonded to a substrate or motherboard that is shared with or electronically coupled to the integrated circuit die 602. The integrated circuit die 602 may include a processor 604 as well as on-die memory 606, often used as cache memory, which can be provided by technologies such as embedded DRAM (eDRAM), or SRAM. For example, the on-die memory 606 may include a transistor, e.g., the transistor 110, or the transistor 120, as shown in FIGS. 1(a)-1(c).

In embodiments, the computing device 600 may include a display or a touchscreen display 624, and a touchscreen display controller 626. A display or the touchscreen display 624 may include a FPD, an AMOLED display, a TFT LCD, a micro light-emitting diode (μLED) display, or others.

Computing device 600 may include other components that may or may not be physically and electrically coupled to the motherboard or fabricated within a SoC die. These other components include, but are not limited to, volatile memory 610 (e.g., dynamic random access memory (DRAM), non-volatile memory 612 (e.g., ROM or flash memory), a graphics processing unit 614 (GPU), a digital signal processor (DSP) 616, a crypto processor 642 (e.g., a specialized processor that executes cryptographic algorithms within hardware), a chipset 620, at least one antenna 622 (in some implementations two or more antenna may be used), a battery 630 or other power source, a power amplifier (not shown), a voltage regulator (not shown), a global positioning system (GPS) device 628, a compass, a motion coprocessor or sensors 632 (that may include an accelerometer, a gyroscope, and a compass), a microphone (not shown), a speaker 634, a camera 636, user input devices 638 (such as a keyboard, mouse, stylus, and touchpad), and a mass storage device 640 (such as hard disk drive, compact disk (CD), digital versatile disk (DVD), and so forth). The computing device 600 may incorporate further transmission, telecommunication, or radio functionality not already described herein. In some implementations, the computing device 600 includes a radio that is used to communicate over a distance by modulating and radiating electromagnetic waves in air or space. In further implementations, the computing device 600 includes a transmitter and a receiver (or a transceiver) that is used to communicate over a distance by modulating and radiating electromagnetic waves in air or space.

The communications logic unit 608 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 600 may include a plurality of communications logic units 608. For instance, a first communications logic unit 608 may be dedicated to shorter range wireless communications such as Wi-Fi, NFC, and Bluetooth and a second communications logic unit 608 may be dedicated to longer range wireless communications such as GPS, EDGE, GPRS, CDMA, WiMAX, LTE, Ev-DO, and others.

The processor 604 of the computing device 600 includes one or more devices, such as transistors. The term "processor" may refer to any device or portion of a device that processes electronic data from registers and/or memory to transform that electronic data into other electronic data that may be stored in registers and/or memory. The communications logic unit 608 may also include one or more devices, such as transistors.

In further embodiments, another component housed within the computing device 600 may contain one or more devices, such as DRAM, that are formed in accordance with implementations of the current disclosure, e.g., the transistor 110, or the transistor 120, as shown in FIGS. 1(a)-1(c); or a transistor formed following the process 200.

In various embodiments, the computing device 600 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

SOME NON-LIMITING EXAMPLES ARE PROVIDED BELOW

Example 1 may include a semiconductor device, comprising: a substrate; a transistor above the substrate, wherein the transistor includes a channel layer above the substrate, and wherein the channel layer includes: a first channel material of a first conductivity; and elements of one or more additional materials distributed within the channel layer, wherein the channel layer including the elements of the one or more additional materials has a second conductivity different from the first conductivity.

Example 2 may include the semiconductor device of example 1 and/or some other examples herein, wherein the elements of the one or more additional materials are bonded with elements of the first channel material.

Example 3 may include the semiconductor device of example 1 and/or some other examples herein, wherein the first conductivity has a first mobility in a range of about 50 $cm^2$/V-s to about 500 $cm^2$/V-s, while the second conductivity has a second mobility in a range of about 1 $cm^2$/V-s to about 30 $cm^2$/V-s.

Example 4 may include the semiconductor device of example 1 and/or some other examples herein, wherein the elements of the one or more additional materials are distributed uniformed in the channel layer, with a concentration level in a range from about $10^{16}$/$cm^3$ to about $10^{19}$/$cm^3$.

Example 5 may include the semiconductor device of examples 1-4 and/or some other examples herein, wherein the one or more additional materials includes a material selected from the group consisting of N, Si, F, Ar, He, C, and O.

Example 6 may include the semiconductor device of examples 1-4 and/or some other examples herein, wherein the first channel material includes a material selected from the group consisting of indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, C-Axis Aligned Crystal (CAAC), molybdenum and sulfur, and a group-VI transition metal dichalcogenide.

Example 7 may include the semiconductor device of examples 1-4 and/or some other examples herein, wherein the substrate includes a material selected from the group consisting of a silicon substrate, a glass substrate, a metal substrate, or a plastic substrate.

Example 8 may include the semiconductor device of examples 1-4 and/or some other examples herein, wherein the channel layer further includes a capping layer above the first channel material and the elements of one or more additional materials.

Example 9 may include the semiconductor device of example 8 and/or some other examples herein, wherein the capping layer is a dielectric layer including a material selected from the group consisting of AlOx, TiOx, SiOx, HfOx, SiNx, and ZrOx.

Example 10 may include the semiconductor device of example 8 and/or some other examples herein, wherein the capping layer is a metallic layer including a material selected from the group consisting of Si, Ti, and Al.

Example 11 may include the semiconductor device of example 8 and/or some other examples herein, wherein the capping layer has a thickness in a range of about 1 nm to about 5 nm.

Example 12 may include the semiconductor device of examples 1-4 and/or some other examples herein, wherein the transistor further includes a gate electrode separated from the channel layer by a gate dielectric layer, a drain electrode, and a source electrode coupled to the channel layer.

Example 13 may include the semiconductor device of example 12 and/or some other examples herein, wherein the gate electrode, the source electrode, or the drain electrode includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

Example 14 may include the semiconductor device of example 12 and/or some other examples herein, further comprising: the gate dielectric layer, wherein the gate dielectric layer includes a material selected from the group consisting of silicon and oxygen; silicon and nitrogen; yttrium and oxygen; silicon, oxygen, and nitrogen; aluminum and oxygen; hafnium and oxygen; tantalum and oxygen; and titanium and oxygen.

Example 15 may include the semiconductor device of examples 1-4 and/or some other examples herein, wherein the transistor is above an interconnect that is above the substrate.

Example 16 may include a method forming a transistor, the method comprising: forming a gate electrode above a dielectric layer, wherein the dielectric layer is above a substrate; forming a gate dielectric layer above the gate electrode; forming a channel layer above the gate dielectric layer, wherein the channel layer includes a first channel material of a first conductivity; adding elements of one or more additional materials into the channel layer, wherein the elements of the one or more additional materials are bonded with elements of the first channel material, and the channel layer including the elements of the one or more additional materials has a second conductivity different from the first conductivity.

Example 17 may include the method of example 16 and/or some other examples herein, wherein the elements of the one or more additional materials are added into the channel layer by in-situ doping, ion beam implantation, or plasma immersion.

Example 18 may include the method of examples 16-17 and/or some other examples herein, further comprising: forming a capping layer above the channel layer including the first channel material before adding the elements of the one or more additional materials into the channel layer, wherein the elements of the one or more additional materials are added into the channel layer through the capping layer.

Example 19 may include the method of example 18 and/or some other examples herein, wherein the elements of the one or more additional materials are added into the channel layer by ion beam implantation through the capping layer, or plasma immersion through the capping layer.

Example 20 may include the method of examples 16-17 and/or some other examples herein, further comprising: forming a gate dielectric layer between the gate electrode and the channel layer; forming a source electrode and a drain electrode coupled to the channel layer.

Example 21 may include a computing device, comprising: a circuit board; and a processor or a memory device coupled to the circuit board, wherein the processor or the memory device includes a transistor, and wherein the transistor includes: a channel layer above a substrate, and wherein the channel layer includes: a first channel material of a first conductivity; and elements of one or more additional materials distributed within the channel layer, wherein the channel layer including the elements of the one or more additional materials has a second conductivity different from the first conductivity.

Example 22 may include the computing device of example 21 and/or some other examples herein, wherein the elements of the one or more additional materials are bonded with elements of the first channel material.

Example 23 may include the computing device of examples 21-22 and/or some other examples herein, wherein the first conductivity has a first mobility in a range of about 50 $cm^2$/V-s to about 500 $cm^2$/V-s, while the second conductivity has a second mobility in a range of about 1 $cm^2$/V-s to about 30 $cm^2$/V-s.

Example 24 may include the computing device of examples 21-22 and/or some other examples herein, wherein the elements of the one or more additional materials are distributed uniformed in the channel layer, with a concentration level in a range of about $10^{16}/cm^3$-$10^{19}/cm^3$.

Example 25 may include the computing device of examples 21-22 and/or some other examples herein, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
   a substrate;
   a transistor above the substrate, wherein the transistor includes a channel layer above the substrate, and wherein the channel layer includes:
      a first channel material of a first conductivity;
      elements of one or more additional materials distributed within the channel layer, wherein the channel layer including the elements of the one or more additional materials has a second conductivity different from the first conductivity;
      a capping layer on the first channel material; and
      a spacer on the capping layer, the spacer and the capping layer having a same lateral width.

2. The semiconductor device of claim 1, wherein the elements of the one or more additional materials are bonded with elements of the first channel material.

3. The semiconductor device of claim 1, wherein the first conductivity has a first mobility in a range of about 50 $cm^2/V\text{-}s$ to about 500 $cm^2/V\text{-}s$, while the second conductivity has a second mobility in a range of about 1 $cm^2/V\text{-}s$ to about 30 $cm^2/V\text{-}s$.

4. The semiconductor device of claim 1, wherein the elements of the one or more additional materials are distributed uniformed in the channel layer, with a concentration level in a range from about $10^{16}/cm^3$ to about $10^{19}/cm^3$.

5. The semiconductor device of claim 1, wherein the one or more additional materials includes a material selected from the group consisting of N, Si, F, Ar, He, C, and O.

6. The semiconductor device of claim 1, wherein the first channel material includes a material selected from the group consisting of indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, C-Axis Aligned Crystal (CAAC), molybdenum and sulfur, and a group-VI transition metal dichalcogenide.

7. The semiconductor device of claim 1, wherein the substrate includes a material selected from the group consisting of a silicon substrate, a glass substrate, a metal substrate, or a plastic substrate.

8. The semiconductor device of claim 1, wherein the capping layer is a dielectric layer including a material selected from the group consisting of AlOx, TiOx, SiOx, HfOx, SiNx, and ZrOx.

9. The semiconductor device of claim 1, wherein the capping layer is a metallic layer including a material selected from the group consisting of Si, Ti, and Al.

10. The semiconductor device of claim 1, wherein the capping layer has a thickness in a range of about 1 nm to about 5 nm.

11. The semiconductor device of claim 1, wherein the transistor further includes a gate electrode separated from the channel layer by a gate dielectric layer, a drain electrode, and a source electrode coupled to the channel layer.

12. The semiconductor device of claim 11, wherein the gate electrode, the source electrode, or the drain electrode includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

13. The semiconductor device of claim 11, further comprising:
   the gate dielectric layer, wherein the gate dielectric layer includes a material selected from the group consisting of silicon and oxygen; silicon and nitrogen; yttrium and oxygen; silicon, oxygen, and nitrogen; aluminum and oxygen; hafnium and oxygen; tantalum and oxygen; and titanium and oxygen.

14. The semiconductor device of claim 1, wherein the transistor is above an interconnect that is above the substrate.

15. A method for forming a transistor, the method comprising:
   forming a gate electrode above a dielectric layer, wherein the dielectric layer is above a substrate;
   forming a gate dielectric layer above the gate electrode;
   forming a channel layer above the gate dielectric layer, wherein the channel layer includes a first channel material of a first conductivity;
   adding elements of one or more additional materials into the channel layer, wherein the elements of the one or more additional materials are bonded with elements of the first channel material, and the channel layer including the elements of the one or more additional materials has a second conductivity different from the first conductivity; and
   forming a capping layer above the channel layer including the first channel material before adding the elements of the one or more additional materials into the channel layer, wherein the elements of the one or more additional materials are added into the channel layer through the capping layer, and wherein the elements of the one or more additional materials are added into the channel layer by ion beam implantation through the capping layer, or plasma immersion through the capping layer.

16. The method of claim 15, further comprising:
   forming a gate dielectric layer between the gate electrode and the channel layer; and
   forming a source electrode and a drain electrode coupled to the channel layer.

17. A computing device, comprising:
   a circuit board; and
   a processor or a memory device coupled to the circuit board, wherein the processor or the memory device includes a transistor, and wherein the transistor includes:
      a channel layer above a substrate, and wherein the channel layer includes:
         a first channel material of a first conductivity;
         elements of one or more additional materials distributed within the channel layer, wherein the channel layer including the elements of the one or more additional materials has a second conductivity different from the first conductivity;
a capping layer on the first channel material; and
a spacer on the capping layer, the spacer and the capping layer having a same lateral width.

18. The computing device of claim 17, wherein the elements of the one or more additional materials are bonded with elements of the first channel material.

19. The computing device of claim 17, wherein the first conductivity has a first mobility in a range of about 50 cm$^2$/V-s to about 500 cm$^2$/V-s, while the second conductivity has a second mobility in a range of about 1 cm$^2$/V-s to about 30 cm$^2$/V-s.

20. The computing device of claim 17, wherein the elements of the one or more additional materials are distributed uniformed in the channel layer, with a concentration level in a range of about $10^{16}$/cm$^3$-$10^{19}$/cm$^3$.

21. The computing device of claim 17, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

* * * * *